(12) United States Patent
Correia et al.

(10) Patent No.: US 9,240,510 B2
(45) Date of Patent: Jan. 19, 2016

(54) CONCENTRATED PHOTOVOLTAIC AND THERMAL SOLAR ENERGY COLLECTOR

(75) Inventors: David Correia, Fremont, CA (US); Arthur M Shulenberger, Millbrae, CA (US); Jim Braig, Piedmont, CA (US)

(73) Assignee: Electrotherm, Inc., Fremont, CA (US)

( * ) Notice: Subject to any disclaimer, the term of this patent is extended or adjusted under 35 U.S.C. 154(b) by 658 days.

(21) Appl. No.: 13/913,377

(22) PCT Filed: Dec. 8, 2010
(Under 37 CFR 1.47)

(86) PCT No.: PCT/US2010/059348
§ 371 (c)(1),
(2), (4) Date: Jun. 7, 2013

(87) PCT Pub. No.: WO2012/078146
PCT Pub. Date: Jun. 14, 2012

(65) Prior Publication Data
US 2014/0026945 A1    Jan. 30, 2014

Related U.S. Application Data

(63) Continuation of application No. 13/027,268, filed on Feb. 14, 2011, now abandoned, which is a continuation-in-part of application No. 12/962,650, filed on Dec. 7, 2010, now Pat. No. 8,455,755.

(60) Provisional application No. 61/283,588, filed on Dec. 7, 2009.

(51) Int. Cl.
*H01L 31/058* (2006.01)
*H01L 31/0525* (2014.01)
(Continued)

(52) U.S. Cl.
CPC ............... *H01L 31/058* (2013.01); *F24J 2/055* (2013.01); *F24J 2/14* (2013.01); *F24J 2/38* (2013.01); *F24J 2/4638* (2013.01); *F24J 2/50* (2013.01); *F24J 2/5245* (2013.01); *F24J 2/541* (2013.01); *H01L 31/0521* (2013.01); *H01L 31/0547* (2014.12); *H01L 31/18* (2013.01);
(Continued)

(58) Field of Classification Search
CPC ......................... H01L 31/058; H01L 31/0521
USPC ......................................................... 136/248
See application file for complete search history.

(56) References Cited

U.S. PATENT DOCUMENTS 3,990,914 A * 11/1976 Weinstein et al. ............ 136/246
4,278,829 A *  7/1981 Powell ........................... 136/248
(Continued)

FOREIGN PATENT DOCUMENTS

WO    WO 2008/048232 A2 *  4/2008    ............ H01L 31/042

*Primary Examiner* — Golam Mowla
(74) *Attorney, Agent, or Firm* — James S McDonald

(57) ABSTRACT

This invention relates to a solar energy collector that converts solar radiation into both electrical and thermal energy. More specifically this invention relates to a concentrating solar energy collector with an integrated construction that minimizes cost, bulk, and weight, and maximizes overall efficiency. Typical non-concentrating solar collectors use photovoltaic cells over the entirety of their surface. These solar cells are the most expensive part of the collector. This invention discloses using a reflector to concentrate the incident radiation on photovoltaic cells with one-twentieth the area of the reflector, and transferring the co-generated thermal energy into a working fluid pumped through the cell support structure.

20 Claims, 13 Drawing Sheets

(51) Int. Cl.

| | | |
|---|---|---|
| *H01L 31/18* | (2006.01) | |
| *F24J 2/05* | (2006.01) | |
| *F24J 2/14* | (2006.01) | |
| *H01L 31/052* | (2014.01) | |
| *H02S 40/44* | (2014.01) | |
| *H01L 31/054* | (2014.01) | |
| *F24J 2/38* | (2014.01) | |
| *F24J 2/46* | (2006.01) | |
| *F24J 2/50* | (2006.01) | |
| *F24J 2/52* | (2006.01) | |
| *F24J 2/54* | (2006.01) | |

(52) U.S. Cl.
CPC ........... *H02S 40/44* (2014.12); *F24J 2002/503* (2013.01); *F24J 2002/5275* (2013.01); *Y02E 10/44* (2013.01); *Y02E 10/45* (2013.01); *Y02E 10/52* (2013.01); *Y02E 10/60* (2013.01); *Y10T 29/49355* (2015.01)

(56) References Cited

U.S. PATENT DOCUMENTS

| | | | |
|---|---|---|---|
| 4,293,732 A * | 10/1981 | Rancourt et al. | 136/257 |
| 4,413,157 A * | 11/1983 | Ames | 136/248 |
| 4,421,104 A * | 12/1983 | Adcock | 126/600 |
| 5,196,206 A * | 3/1993 | Troia et al. | 425/28.1 |
| 6,465,725 B1 * | 10/2002 | Shibata et al. | 136/246 |
| 6,994,082 B2 * | 2/2006 | Hochberg et al. | 126/696 |
| 7,076,965 B2 * | 7/2006 | Lasich | 62/259.2 |
| 2007/0068571 A1 * | 3/2007 | Li et al. | 136/258 |
| 2007/0215199 A1 * | 9/2007 | Dold et al. | 136/246 |
| 2010/0282315 A1 * | 11/2010 | Gilbert | 136/259 |

* cited by examiner

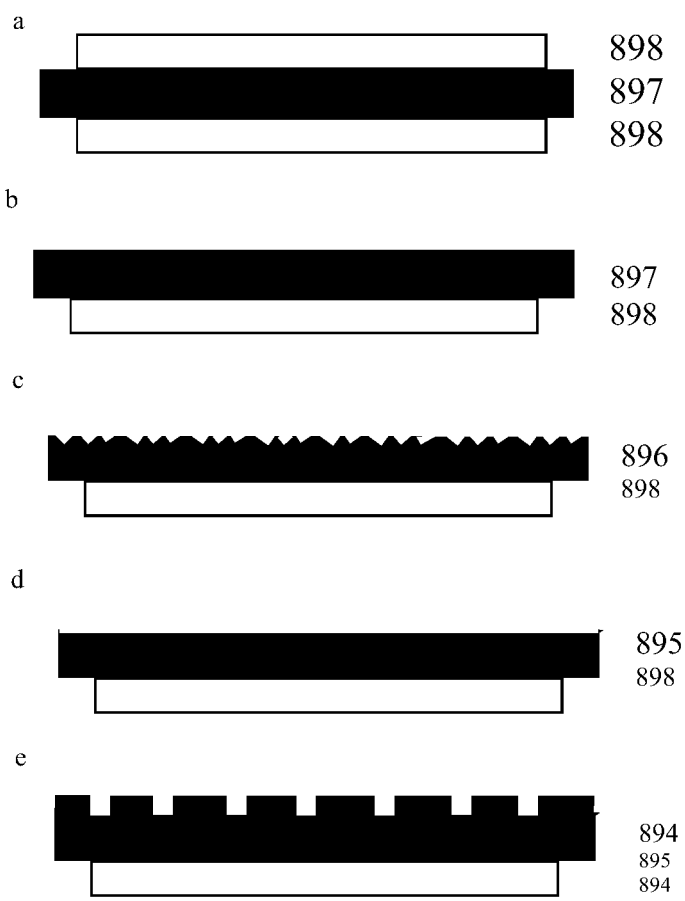
Figs. 8a—8e f
g
h
i
Figs. 8f—8i

CONCENTRATED PHOTOVOLTAIC AND THERMAL SOLAR ENERGY COLLECTOR

CROSS-REFERENCE TO RELATED APPLICATIONS

This application is a continuation of U.S. patent application Ser. No. 13/027,268, filed Feb. 14, 2011, which is a continuation-in-part of U.S. patent Ser. No. 12/962,650, filed Dec. 7, 2010, which claims priority per 35 U.S.C. §119(e)(1) to the Provisional Application No. 61/283,588, filed Dec. 7, 2009 and is a 371 of International Application No. PCT/US10/059348, filed Dec. 8, 2010, each of which are incorporated by reference in its entirety.

BACKGROUND OF THE INVENTION

Conventional solar collectors have a low energy conversion efficiency. A typical flat panel photovoltaic (PV) panel converts only 15-20% of the incident radiant energy into electricity, while a typical flat panel thermal energy collector converts approximately 50% of the incident radiant energy into heat. Because they do not concentrate the solar energy, flat panel thermal collectors are typically incapable of being used in applications where it is desired to heat a fluid to temperatures above 150° F. This results in a "low quality heat" as it is referred to in the industry. A representative flat panel device is disclosed in U.S. Pat. No. 4,392,008 (hereinafter "Cullis").

Conventional flat panel solar collectors are also expensive, primarily because they contain a large number of silicon solar cells. A typical PV panel producing approximately 250 W of electrical power contains approximately 20 square feet of silicon solar cells, which require solar grade silicon (e.g., 6N purity). Those cells are the most expensive component of the typical solar panel, even if the most inexpensive form of silicon suitable for solar panel use.

Because of their low efficiency and corresponding need for increased size, conventional solar collectors are typically large and heavy. This reduces their mounting options, or increases the expense and flexibility of mounting. This leaves the user limited in ability to use an optimum number of solar cells and limited in the ability to optimally locate the solar collector.

These disadvantages have led to a variety of attempted solutions involving concentrating the radiant solar energy. For example, Hines, et al. disclose concentrating "modules having a convenient size and market acceptance of traditional flat photovoltaic solar panels." Pub. No. U.S. 2007/0193620 A1, which is incorporated herein by reference in its entirety. A lightweight, low-cost concentrating solar energy collector is disclosed by Hochberg and Costen (FIG. 1) that employs a parabolic reflector in a cylindrical housing. U.S. Pat. No. 6,994,082, which incorporated herein by reference in its entirety. Gilbert discloses a low concentrating photovoltaic thermal solar collector employing "at least one elongated cross-sectionally V-shape beam, a first and second sunray light reflecting surfaces integral to the respective interior faces of the V-shape beam side legs." Pub. No. U.S. 2010/0282315, which is incorporated herein by reference in its entirety. But a disadvantage of such concentrating systems is that concentrated photovoltaic "operates most effectively in sunny weather since clouds and overcast conditions create diffuse light, which essentially cannot be concentrated." U.S. Pub. No. U.S. 2010/0282315, which is incorporated herein by reference in its entirety.

By way of background, U.S. Pat. No. 6,111,190, which is incorporated herein by reference in its entirety, discloses a Fresnel lens solar concentrator made of light weight materials that can be used in space. U.S. Pat. No. 6,075,200, which is incorporated herein by reference in its entirety, discloses a stretched Fresnel lens solar concentrator for use in space. U.S. Pat. No. 6,031,179, which is incorporated herein by reference in its entirety, discloses a color-mixing lens for solar concentrator systems that increases power output by chromatically dispersing light. U.S. Pat. No. 5,505,789, which is incorporated herein by reference in its entirety, discloses a photovoltaic module using low-cost materials for high performance using an array of arched Fresnel lenses. U.S. Pat. No. 5,498,297, which is incorporated herein by reference in its entirety, discloses a photovoltaic receiver with a PV cell coupled to a heat sink using a Tefzel film. U.S. Pat. No. 4,719,904, which is incorporated herein by reference in its entirety, discloses a solar thermal receiver designed to minimize heat loss. U.S. Pat. No. 4,711,972, which is incorporated herein by reference in its entirety, discloses a PV cell for use with an optical concentrator. U.S. Pat. No. 4,672,949, which is incorporated herein by reference in its entirety, discloses another solar energy collector designed to minimize heat loss. U.S. Pat. No. 4,545,366, which is incorporated herein by reference in its entirety, discloses a bi-focused solar energy concentrator. U.S. Pat. No. 6,990,830, which is incorporated herein by reference in its entirety, discloses a system and method for supplying consumers with heat energy or cooling energy. U.S. Published Application No. 20010013207A1, which is incorporated herein by reference in its entirety, discloses a passive collimating tubular skylight for collecting radiant energy. WO2007109901A1, which is incorporated herein by reference in its entirety, discloses a support structure for a solar collector system. WO2007103300A1, which is incorporated herein by reference in its entirety, discloses a solar collector with a trough-like reflector and an absorber for receiving solar radiation. WO2007109899A1, which is incorporated herein by reference in its entirety, discloses an energy supply system using a thermal storage container and one or more solar collectors for use therewith. WO05090873A1, which is incorporated herein by reference in its entirety, discloses a solar collector with a linear reflector and an absorber spaced from the reflector for receiving solar radiation and conveying heat therefrom to a fluid. U.S. Pat. No. 4,224,082, which is incorporated herein by reference in its entirety, discloses a multi-functional solar collector pole. U.S. Pat. No. 4,323,052, which is incorporated herein by reference in its entirety, discloses a solar energy system. U.S. Pat. No. 4,392,008, which is incorporated herein by reference in its entirety, discloses a combined electrical and thermal solar collector. U.S. Pat. No. 4,491,681, which is incorporated herein by reference in its entirety, discloses a liquid cooled, linear focus solar cell for use with parabolic or Fresnel optical concentrators. U.S. Pat. No. 4,700,013, which is incorporated herein by reference in its entirety, discloses a hybrid PV and solar heat energy system and concentrator. U.S. Pat. No. 4,892,593, which is incorporated herein by reference in its entirety, discloses a solar energy collector using light funneling, a Fresnel lens, and a PV panel. European Published Application No. EP0384056A1 discloses solar collectors that generate both thermal and electric energy.

Thus, there presently exists the need for a solar energy collector with increased efficiency, a reduced need for silicon cells, a construction that increases mounting options by reducing weight and bulk, and improved performance in overcast conditions. Furthermore, solar panels are subject to failure, most commonly due to water damage to the panel.

This causes added expense, loss of efficiency, and mounting limitations as traditionally it is recommended to not mount panels horizontally to avoid water collection. Water damage is also caused by commonly experienced environmental conditions, such as high humidity, rain, and condensation, making the use of solar cells in such environments challenging. There exists a need to reduce solar cell failure and provide an option that can minimize the challenge of using solar energy collectors in such environments.

BRIEF SUMMARY OF PREFERRED EMBODIMENTS

In one preferred embodiment, the solar concentrator described herein converts incident solar energy into both heat and electricity. Summing both thermal and electrical energy outputs, the conversion efficiency of an embodiment of the present invention is approximately 80%. Furthermore, a preferred embodiment of the present invention uses only one-twentieth the area of silicon cells to produce the same amount of electrical energy as a conventional solar panel, greatly reducing the material cost. This is accomplished by concentrating approximately twenty square feet of incident energy onto an approximately one square foot photovoltaic cell using a parabolic trough reflector and combining the reflector's photovoltaic target and thermal target into one device. In addition, according to a preferred embodiment, by combining the reflector's photovoltaic target and thermal target into one device and integrating structural elements of the PV and thermal solar energy collector, the user gains a significant advantage in flexibility of mounting location and positioning options, which leads to increased efficiency in use due to the ability to optimize location. The collectors herein are highly modular in nature, allowing for flexibility in design and utility in positioning, such as on a rooftop where space is available and obstructions are minimized. For example, a four unit concentrator may be designed to produce 1000 W output. If additional power output is preferred or there is a desire to supplement power output, additional units may be combined to meet the needs of the application. In a preferred embodiment, the geometry is aerodynamic in design to limit wind resistance and minimize the need to use high strength materials to compensate for environmental stresses.

Furthermore, according to a preferred embodiment, by combining the photovoltaic target and thermal target into one device, a receiver for example, encasing that device in a transparent tube, and evacuating the atmosphere from that tube, the photovoltaic target is isolated from moisture and other detrimental environmental elements, and thermal losses due to convection are reduced.

BRIEF DESCRIPTION OF THE SEVERAL VIEWS OF THE DRAWING

The foregoing and other aspects and advantages of the embodiments described herein will be better understood from the following detailed descriptions of particular embodiments with reference to the drawings.

FIGS. 8a-8i are cross-sectional views of stages of the manufacture of solar collector embodiments exemplified herein.

Like reference numerals refer to corresponding elements throughout the several drawings.

DETAILED DESCRIPTION

Figure 1:
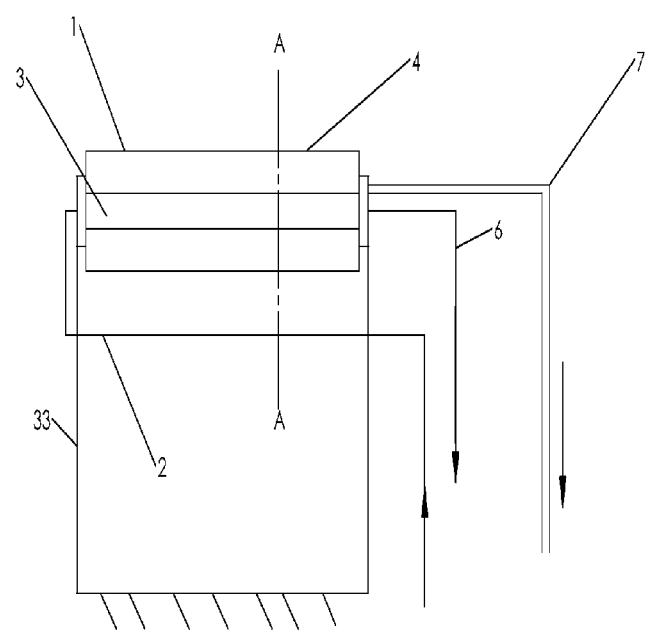
FIG. 1 is a block diagram of an embodiment of the solar collector system described herein.

The embodiments herein preferably use a reflective or mirror surface formed in a parabolic trough, such that the reflective surface directs solar radiation from the sun to a receiver or set of receivers suspended above the reflective surface. The embodiments herein are designed to produce both electricity and thermal energy.

The receiver or receivers have solar cells, preferably on the underside, such that the solar cells or photovoltaics produce electricity. Solar cells operate more efficiently when cooled. In a preferred embodiment, a cooling fluid flows through the back of the solar cells to extract heat from the solar cells and regulate their internal cell temperature. The cooling fluid removes heat in the form of heated fluid to facilitate a simultaneous dual output: electricity and hot fluid.

Due to the shape of the mirror or mirrored surface, the solar energy is focused to a point, a focal point where the solar energy is concentrated. One advantage is that the silicon that makes up the solar cells is relatively expensive while the mirrored surface material is relatively less expensive, such that if the mirrored surface is maximized and the silicon is minimized, the cost per unit of output power is minimized.

The solar cells used in the preferred embodiments operate at a concentration of from about 10 to about 100 times, more preferably from about 20 to about 50 times, more preferably from about 25 to about 35 times.

In a preferred embodiment the system operates under substantially direct sunlight. Because the trough focuses the light to a point it is preferred to track the sun as the sun moves across the sky. It is also preferred to adjust the vertical orientation based on the season to maximize solar input. In a preferred embodiment, the tracking system uses a microprocessor which has an algorithm that knows exactly where the sun is at any time of any day of the year and determines the most effective positioning of the solar concentrator.

An example of one embodiment is a solar energy generating system that has a solar energy collector. The solar energy collector optionally has a cover in a preferred embodiment that provides protection from the elements and insulates from heat loss. The solar energy collector is constructed using one or more concentrating reflectors, one or more photovoltaic cells, one or more ribs to provide structural integrity, and a photovoltaic cell mounting structure, preferably in contact with a heat receiving and conveying medium. The conveying medium is a working fluid, such as a mixture of water and antifreeze. The heat receiving medium may preferably be a phase changing material at the preferred temperature, such as a wax or the like. An example of such a solid is wax with a melt temperature from about 115° F. to about 185° F., depending upon the preferred application. Where the target use is conventional heating, a lower temperature range of about 115° F. to about 140° F. may be used. For air conditioning applications, a higher temperature range of about 170° F. to about 185° F. may be preferred. Where both such uses is the goal, an intermediate temperature of from about 140° F. to about 170° F. Where a phase change material is used, the temperature is more easily regulated and a greater amount of heat may be absorbed, making such a material the preferred heat receiving medium.

Where the embodiment has a cover, the cover is translucent or transparent to solar radiation.

In operation, the concentrating reflector directs concentrated solar radiation onto the one or more photovoltaic cells, which convert part of said concentrated solar radiation into electrical energy and, in a preferred embodiment, a larger part of said concentrated solar radiation into thermal energy. The one or more photovoltaic cells conduct the thermal energy to the photovoltaic cell mounting structure and the cell mounting structure conducts said thermal energy into the heat absorbing material, such as a working fluid which can transfer the absorbed heat to a number of mediums, such as a phase changing solid or other heat absorbing means.

Structurally, in a preferred embodiment, the cover, reflector, and structural ribs are integrally connected together such that they support said solar energy collector. The reflector surface can be made of a number of materials that act as mirrored surfaces. The structural ribs may be translucent, transparent or reflective in some embodiments. In other embodiments the structural ribs are formed in a perimeter with no material in the middle portion to allow sunlight to directly contact a maximum surface area of the reflector and reflect a maximum amount of the sunlight to the receiver.

In a preferred embodiment, the solar energy system is mounted with a tilt mechanism that provides the ability to tilt said solar energy collector on a vertical plane. This compensates for the incident angle of sunlight during different times of year based on the trajectory of the sun. In addition, a preferred embodiment has a rotating mechanism to provide the ability to rotate the solar energy collector to increase, optimize or maximize the incident light throughout the course of the day.

In a preferred embodiment, the solar energy system uses a control module in communication with the tilt mechansim wherein the control module directs the tilt mechanism to tilt said solar energy collector to a specified tilt angle. The control module preferably determines the specified tilt angle using a latitude and longitude associated with the solar energy collector, and a date and time said solar energy collector is to be tilted. In a preferred embodiment, the control module of the solar energy system receives environmental data and determines when to place said solar energy collector in a protected orientation based on the environmental data. The environmental data may be vibrational data. Excessive vibration may be caused by buffeting of the collector in high winds of a storm. In such a case, vibration data could cause the control module to turn the collector face down to protect it from wind born debris, for example. The environmental data may also be a measure of solar radiation incident on the solar collector.

In an embodiment, the control module receives operating data from the solar collector and adjusts said specified direction based on that operating data. The operating data may be voltage data from the photovoltaic cell and said specified tilt angle and rotation may be chosen to maximize the voltage data. The operating data may also be temperature data from the solar collector and the specified rotation may be selected to optimize said temperature or reduce the temperature if the system is overheating. The operating data may also be a fluid flow rate and the specified rotation is chosen to position the solar collector in a protected orientation. One embodiment of the solar energy systems herein uses a switch that causes the control module to position the solar collector in a protected orientation.

In a preferred embodiment the solar energy system uses a transparent or translucent covered tube and two end caps positioned around the cell mounting structure and the one or more photovoltaic cells. The transparent covered tube, end caps, and cell mounting structure create an airtight volume about said photovoltaic cell.

In one embodiment, the solar energy system uses a cooling system that contains a heat absorbing media, such as wax, and a working fluid, such as a fluid mixture of water and glycol to move the heat which can be stored in said heat absorbing media, which is preferentially a phase changing media to regulate temperature and maximize heat storage. In a preferred embodiment, the solar energy system the covered tube is airtight and is evacuated of air to decrease the convection of thermal energy away from the cell mounting structure and the one or more photovoltaic cells. The solar energy system may also use a reflective coating applied to an inner portion of the transparent covered tube, such that the reflective coating reflects the concentrated solar radiation toward the cell mounting structure.

In another embodiment, the solar energy system also may contain a plurality of cell mounting structures and a plurality of photovoltaic cells, wherein the plurality of cell mounting structures are positioned linearly and the structures may also contain bores axially aligned with one or more fluid tubes running through the bore for the length of the aligned plurality of cell mounting structures. In an alternative structure, a phase changing medium is used in place of the fluid. In another alternative, the fluid tubes are in contact with the mounting structures to cool the photovoltaic cells or to absorb and collect heat from the collector.

The solar energy system embodiments preferably uses a reflector that concentrates solar radiation onto an area of the plurality of photovoltaic cells that is from about one tenth to one hundredth of the surface area of the reflector thereby creating about a 10× to about a 100× concentration of solar radiation, preferably from about one twentieth to about one fortieth, more preferably from about one twenty-fifth to about one thirty-fifth, most preferably about one thirtieth or about one twentieth.

In one embodiment, the plurality of photovoltaic cells comprise single junction silicon solar cells, with spacings of less than 100 microns between the P+ and N+ regions in said single junction silicon solar cells, to allow linear operation of the single junction solar cells at about a 20× to 30× concentration of solar radiation. Operation at concentration ranges above about 10× require such small spacing. The solar energy system may have a plurality of photovoltaic cells that comprise single junction silicon solar cells with nano-structures, such as nano-tube structures, between the P+ and N+ regions to allow linear operation of said single junction solar cells at the particular concentrations of solar radiation.

In another embodiment, the plurality of photovoltaic cells comprise multi junction gallium arsenide (GaAs) photovoltaic cells, such as those available from Spectrolab, Inc. Though they are more expensive, GaAs cells have efficiencies that can exceed 40%, significantly higher than the single junction silicon solar cell. A still further embodiment employs photocells with gallium indium phosphide (GaInP). GaInP photovoltaic cells have efficiencies higher than silicon cells, such as boron-doped Czochralski (CZ) silicon wafers or floating zone (FZ) doped wafers. Other alternatives include gallium-doped CZ (Ga:CZ), magnetically grown CZ (MCZ), and boron-doped FZ silicon (B:FZ). All three of these materials have been shown to exhibit no measurable degradation after light exposure (LID) and result in a longer efficient life cell.

Alternative efficiency techniques may be employed with the embodiments herein, such as the use of preferred textures such as random pyramid textured surface to reduce reflection, the use of an antireflective coating such as a silicon nitride antireflection coating, narrow laser-machined line width may be used to minimize shading, high conductivity copper metallization may be used as well.

A preferred embodiment herein includes a method of manufacturing a solar energy collector for later assembly. The manufacturing includes creating a cover, a reflector, a plurality of ribs, and a covered tube assembly. The parts may be assembled before or after shipping. If, for example, the parts are assembled after shipping, the reflector may be positioned about said ribs to form a concentrating reflector. The ribs may be positioned about the covered tube assembly to place the covered tube assembly at a focal point of the concentrating reflector, and said cover may be positioned about the covered tube assembly at a position determined by the concentrating reflector.

Referring now to FIGS. 1-6, which show preferred embodiments of a concentrating photovoltaic and thermal solar energy collector, the following describes such figures in further detail. In FIG. 1, a block diagram shows solar collector 1 held by frame 33 and oriented to receive solar radiation. Cool fluid supply 2 is connected to solar collector 1 to direct fluid through covered tube assembly 3. Reflector 4 directs solar radiation onto covered tube assembly 3. Reflector 4 particularly directs solar radiation onto photovoltaic cell 5 (see FIG. 3), an element of covered tube fluid assembly 3. Covered tube assembly 3 absorbs and transfers part of the energy from the solar radiation into the fluid supplied by cool fluid supply 2. Warmed fluid exits covered tube assembly 3 into warm fluid return 6. Warm fluid return 6 directs warmed fluid to devices (not shown) utilizing warm fluid, such as radiators, storage tanks, or other devices known to those of skill in the art. Covered tube assembly 3, by way of photovoltaic cell 5, also converts part of the solar radiation into electrical energy. Covered tube assembly 3 outputs DC electrical power via power leads 7.

Figure 2:
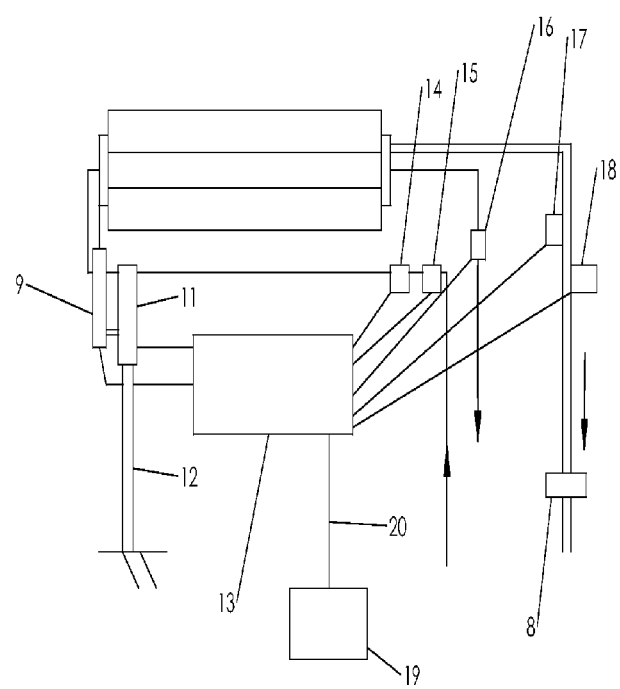
FIG. 2 is a block diagram of another embodiment of the solar collector system described herein.

Referring to FIG. 2, in an embodiment power leads 7 are connected to DC-AC inverter 8, which outputs AC electrical power. Rotation actuator and sensor 9 connects solar collector 1 to base 12 in a manner allowing rotation actuator and sensor 9 to rotate solar collector 1 about an axis parallel to that of covered tube assembly 3. This rotating allows rotation actuator and sensor 9 to position solar collector 1 to track at least a portion of the daily movement of the sun across the sky. Tilt actuator and sensor 11 connect solar collector 1 to base 12 in a manner allowing tilt actuator and sensor 11 to pivot solar collector 1 about an axis perpendicular to that of covered tube assembly 3. This pivoting allows tilt actuator and sensor 11 to position solar collector 1 for seasonal tracking of the sun.

Cool fluid supply 2 is equipped with input temperature sensor 14 and fluid flow sensor 15. Warm fluid return 6 is equipped with output temperature sensor 16. Power leads 7 are equipped with DC voltage sensor 17 and DC current sensor 18. Tilt actuator and sensor 11, rotation actuator and sensor 9, input temperature sensor 14, fluid flow sensor 15, output temperature sensor 16, DC voltage sensor 17, and DC current sensor 18 are placed in communication with control and interface module 13. Control and interface module 13 regulates fluid flow to maintain fluid temperature in a design range of 150° F.-175° F. In an embodiment, control and interface module 13 is in communication with personal computer 19 via USB cable 20. One of skill in the art would understand that the communications between the sensors and control and interface module 13, and between interface module 13 and computer 19, could be performed wirelessly.

Figure 3:
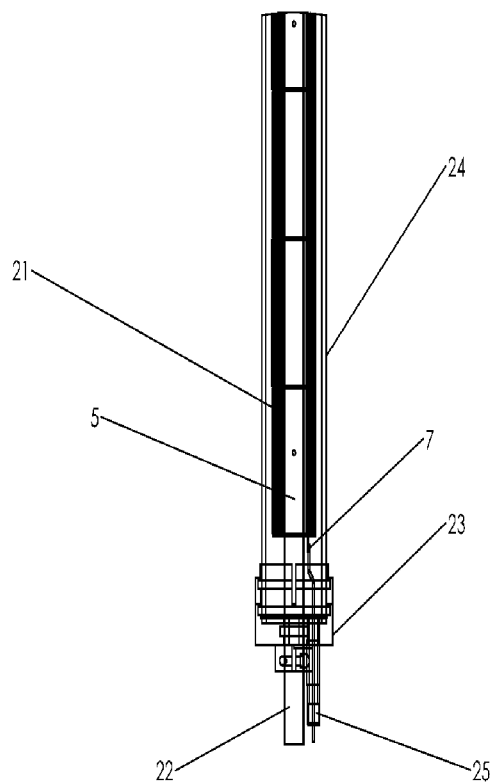
FIG. 3 is a drawing of the covered tube assembly of the solar collector in FIG. 1.

FIG. 3 depicts one end of covered tube assembly 3 and the side that receives solar radiation from reflector 4. An electrically insulating heat conducting elastomeric material may be used to mount the PV to the heat sink Photovoltaic cell 5 is mounted onto cell mounting structure 21. Core fluid tube 22 passes through end cap 23 via bore 28 (see FIG. 4a). A thermal connection between core fluid tube 22 and cell mounting structure 21 is made by minimizing the space between the two, and filling what space remains with thermally conductive grease (not shown) or an electrically insulating heat conducting elastomer material (not shown). Cover tube 24 is transparent to solar radiation and surrounds photovoltaic cell 5, cell mounting structure 21, and core fluid tube 22. Cover tube 24 slides into and seals against end cap 23. Power leads 7 pass through end cap 23 via lead spout 25.

Covered tube assembly 3 has an end cap 23 at each end. End caps 23 are made of aluminum and join cover tube 24 and core fluid tube 22 to create an air tight seal. Though other materials, including molded plastic, can be used for end cap 3 care must be taken to match the chosen material's thermal expansion coefficients with those of cover tube 24 and core fluid tube 22. In the preferred embodiment, matching and sealing is done using "O" rings (not shown) made of ethylene propylene diene rubber (epdm) or ethylene-propylene rubbers (EPR). Alternatively, the sealing may be accomplished by metalizing a portion of cover tube 24 and soldering end cap 23 to it, or by using a melted glass frit for the bond. In one embodiment one end cap 23 can be removable while the other is permanently bonded. This allows disassembly of covered tube assembly 3 for maintenance or upgrade. One end cap 23 provides lead spout 25, for power leads 7 (see FIG. 1). Preferably, lead spout 25 is sealed after power leads 7 are routed through it. One end cap 23 provides a tube and valve (not shown) for evacuation. Alternatively the tube and valve could be replaced by a copper tube that can be cold welded post-evacuation, as is commonly used in refrigeration systems.

Figure 4A:
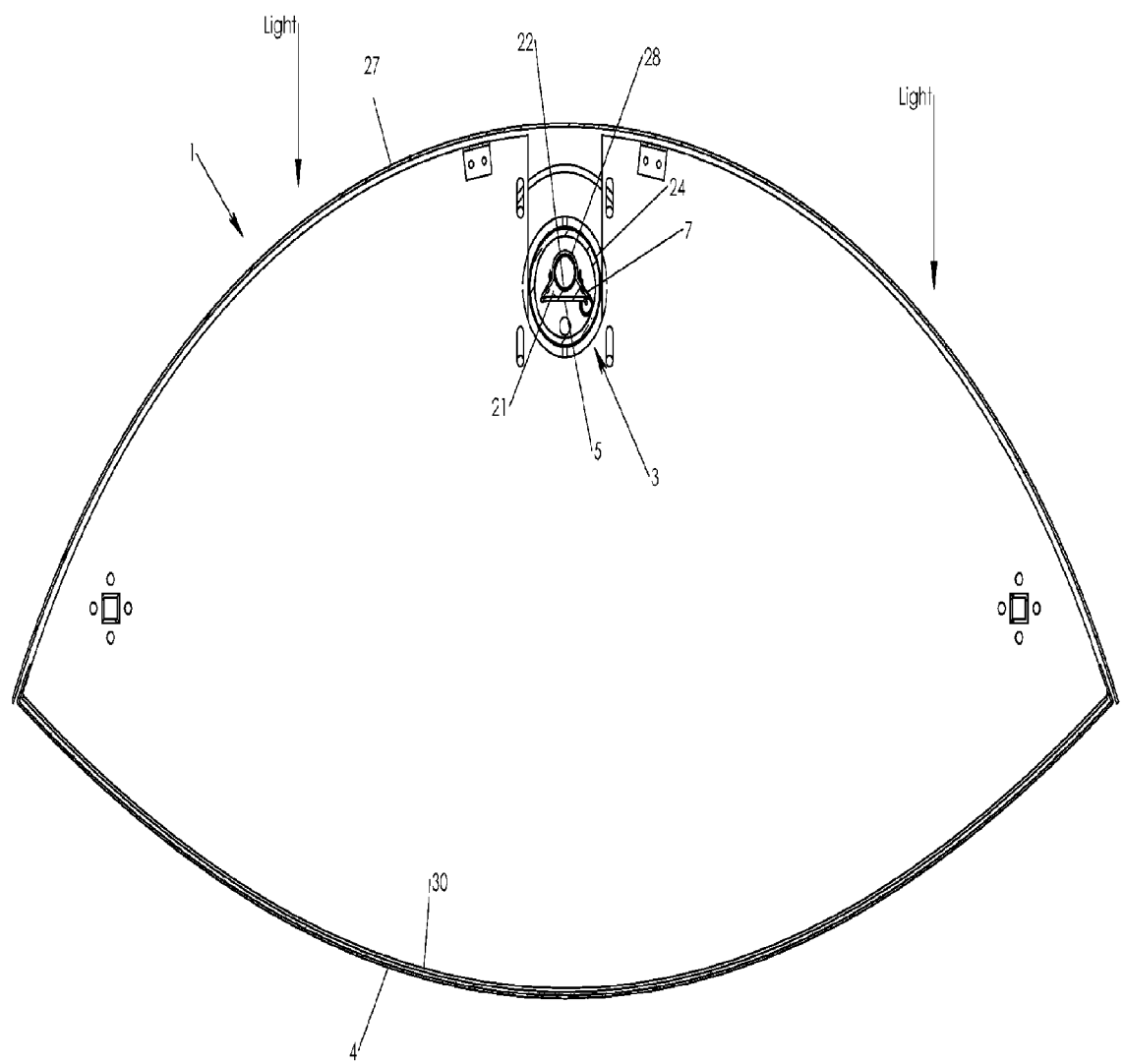
FIG. 4a is a cross-section of the solar collector along line A-A of FIG. 1.
Figure 4B:
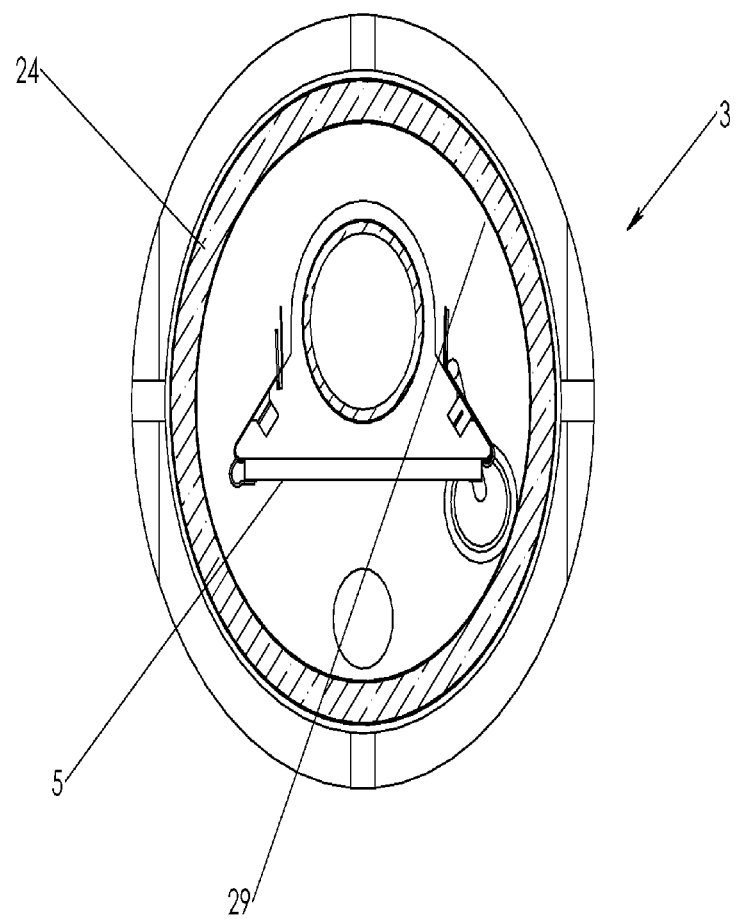
FIG. 4b is a cross-section of another embodiment of the solar collector along line A-A of FIG. 1.

FIG. 4a is a cross-section of solar collector 1 along lines A-A of FIG. 1. Covered tube assembly 3 is positioned with photovoltaic cell 5 near the focal point of reflector 4 and held in place by reflector ribs 26 (see FIG. 5). Front cover 27 is transparent to solar radiation and is connected to reflector 4, with covered tube assembly 3 contained in the created space. Incident solar radiation passes through front cover 27. Part of that incident radiation also passes through cover tube 24 to strike cell mounting structure 21. Cell mounting structure 21 absorbs and transforms much of this radiation into thermal energy. The thermal energy is conducted throughout cell mounting structure 21 to core fluid tube 22, which is in thermal contact with cell mounting structure 21, and contributes to warming fluid from cool fluid supply 2 (FIG. 1). Radiation not immediately passing through cover tube 24 continues and reflects off reflector 4, is concentrated by the focusing shape of reflector 4, passes through cover tube 24, and strikes photovoltaic cell 5. Photovoltaic cell 5 converts the solar radiation into electrical energy according to its efficiency, absorbs much of the remaining solar radiation as thermal energy, and conducts it to cell mounting structure 21, core fluid tube 22, and the fluid inside.

In a preferred embodiment, core fluid tube 22 is a single copper tube, approximately 8' long and ½" nominal ID. External pumps (not shown) pump fluid to be heated through core fluid tube 22. By confining core fluid tube 22 to a single copper tube for the length of solar collector 1, fluid leaks inside the collector are minimized. Fabricating core fluid tube 22 from copper provides a long life, though other materials may be suitable including stainless steel. Materials prone to corrosion should be avoided. Also, in this embodiment cell mounting structure 21 is an aluminum extrusion with bore 28 through it. Core fluid tube 22 is slid inside bore 28 to provide a thermal path between cell mounting structure 21 and the working fluid from cool fluid supply 2, which is water and anti-freeze fluid in a preferred embodiment. Cell mounting structure 21 provides a flat mounting surface for photovoltaic cell 5.

In this embodiment, some solar radiation is converted into electricity. Much more is captured as heat and transferred to the working fluid. Transferring heat to the fluid generates heat output from collector assembly 1. Removing heat from cell mounting structure 21 lowers the temperature experienced by photovoltaic cell 5, which makes it more efficient. In a preferred embodiment, the thermal connection between cell mounting structure 21 and core fluid tube 22 is augmented by thermal conductive grease or paste (not shown). Alternatively cell mounting structure 21 could be press fit or crimped onto the core fluid tube 22. In addition to extruding cell mounting structure 21 from aluminum, other metals such as copper or any good heat conductor could be used. Alternately, structure 21 could be molded using a good thermal conductivity plastic.

In one embodiment, covered tube assembly 3 eliminates core fluid tube 22. Fluid from cool fluid supply 2 flows to warm fluid return 6 through bore 28 in cell mounting structure 21.

One feature of the present invention is that the working fluid is heated by concentrated solar radiation from reflector 4. Some radiation is converted into electricity while much more is captured as heat and transferred to the working fluid. This allows the working fluid to reach and be maintained at 150-175 F. This high temperature is referred to in the industry as a "high quality" heat. Such temperatures are not achievable in thermal collectors that do not concentrate the solar rays, such as that disclosed by Cullis. Solar concentration at or above 20× is required to achieve fluid temperatures considered to have "high quality". Concentration above 10× requires modifications to the PV solar cells such as smaller junction spacing as discussed above. Concentration above about 50× requires even further and more costly modification of the PV solar cells. Thus, concentration of optimally 20× provides significantly high enough fluid temperature for the collected thermal energy to be considered "high quality" and can be accommodated by only minor modifications to the PV solar cell, keeping costs of generating electrical energy low.

The preferred embodiment uses eight cell mounting structures 21, each 1 foot long, in solar collector 1. This facilitates mounting photovoltaic cells 5. One would understand that longer cell mounting structure 21 sections could be used up to the length of solar collector 1. This would facilitate eliminating core fluid tube 22. Cell mounting structure 21 needs to have good heat transfer properties. It should also allow for the differing thermal expansion properties of photovoltaic cell 5 and the material comprising cell mounting structure 21. In the preferred embodiment, this is achieved using a flexible high temperature conductive adhesive. Alternate bonding process could involve press fitting or bendable tabs to secure the photovoltaic cells. Matching the thermal expansion of the photovoltaic cell 5 and the material comprising cell mounting structure 21 could also be done—allowing the use of a rigid bond between the two.

Reflector 4 is a thin piece of polished stainless steel sheet metal bent and held in a parabolic shape focusing the incident radiation onto covered tube assembly 3 and photovoltaic cells 5 and cell mounting structure 21 housed within. Reflector 4 can also be made of other materials such as aluminum or plastics. The preferred embodiment incorporates reflector film 30 bonded to the reflector using pressure sensitive adhesive to produce a highly reflective surface at low cost. This is preferable to polishing the surface of reflector 4 itself. The particular film used in the preferred embodiment is: ReflecTech Mirror Film™.

In the preferred embodiment cover tube 24 is clear all the way around. Concentrated radiant energy from reflector 4 enters from approximately the half of cover tube 24 nearest reflector 4. In one embodiment, depicted in FIG. 4b a reflective coating 29 or physical reflector is added to the half of cover tube 24 that is opposite from reflector 4. Reflective coating 29 reflects concentrated solar radiation back onto cell mounting structure 21.

Figure 5:
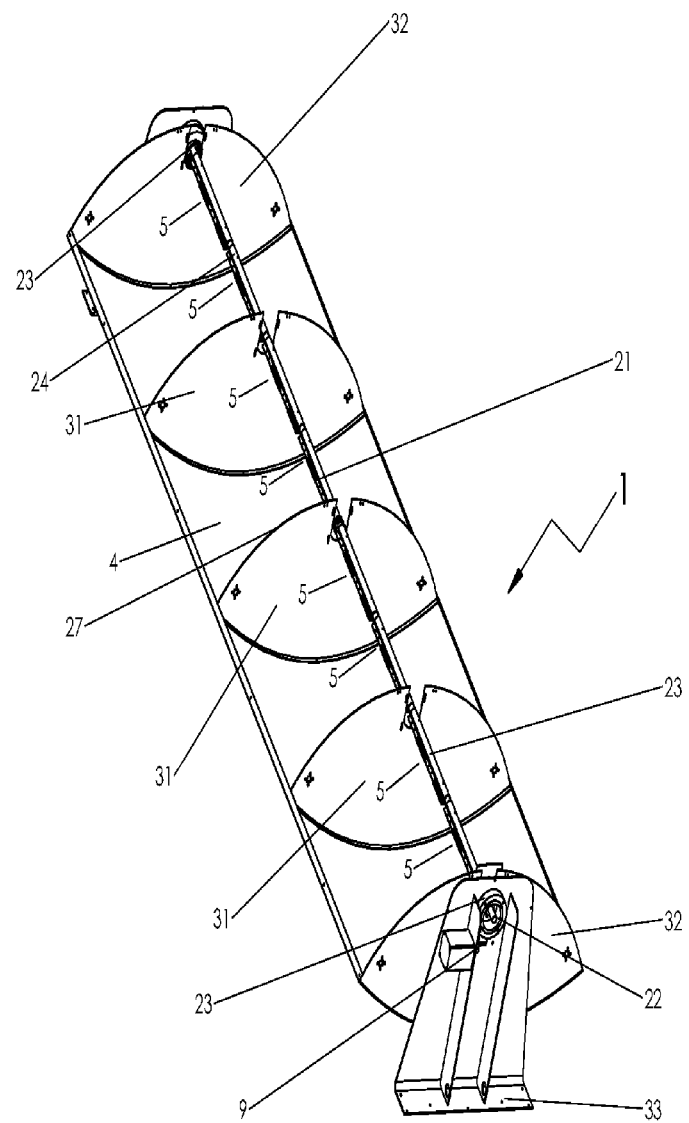
FIG. 5 depicts the solar collector in FIG. 1.

Referring to FIG. 5, assembly of the preferred embodiment involves sliding cell mounting structures 21, eight of them with photovoltaic cells 5 attached, over core fluid tube 22. Cell mounting structures 21 are secured in place with set screws and good thermal contact is insured with a conductive paste or grease (not shown). Once all cell mounting structures are in place, electrical connections are made that place photovoltaic cells 5 in electrical series (not shown). Core fluid tube 22 is used as the conductor returning the connection from one end photovoltaic cell 5 to the opposite end's end cap 23, so that both electrical contacts can be made from the same side of covered tube assembly 3. Multiple solar collectors 1 can be connected in a system, preferably with each supplied with a DC-AC inverter 8 (see FIG. 2, alternatively this could be a DC-DC converter). This eliminates the risk of shaded collectors 1 shunting current from fully illuminated units. In an embodiment, such inverters are added to each individual cell mounting structure 21 to improve performance.

Photovoltaic cell 5 is the element that converts incident radiation into electricity. In the preferred embodiment, photovoltaic cell 5 is operating with a 20× or higher concentration of the incident radiation. In the industry this is referred to as a medium concentration. High concentrations are on the order of 100-1000×. In the preferred embodiment, photovoltaic cell 5 is a single junction silicon solar cells because they are the most cost effective. Other technology cells can be used, such as GaAs, Ga-doped silicon or other materials discussed herein or multi junction technologies, each having a particular cost—performance trade off.

Typical single junction silicon solar cells made of medium resistivity material do not operate well at a 20× concentration—they work better up to approximately 5×. Above 5× they are said to become non-linear. Their output current drops as the incident energy concentration rises in a phenomenon that resembles increasing internal shunt resistance. The physical limitations are traceable in part to the rise of the minority carrier recombination in the PN junction and the physical resistance of the electrical contacts.

Still regarding FIG. 5, in the preferred embodiment photovoltaic cells 5, cell mounting structures 21 (see FIG. 4a), and core fluid tube 22 all contained within cover tube 24. Cover tube 24 is made of BoroSilicate Glass, which is transmissive of the terrestrial solar spectra, sustains high temperatures, and is strong. Aluminum adapter plates (not shown) are placed between the cell mounting structures 21 (see FIG. 4a) and around core fluid tube 22 to maintain the position of core fluid tube 22 within the cover tube 24. The aluminum adapter plates could be of another material, but care must be taken in selecting the material for the elements that are within cover tube 24 because they are also in the 20× intensified beam of incident energy and will get hot. Alternately the function of the adapter plate could be incorporated into cell mounting structure 21, eliminating the need for these adapter plates.

To improve the overall thermal efficiency of solar collector 1 the air space inside covered tube assembly 3 is evacuated. This minimizes convective losses and maximizes the heat flowing into the fluid in core fluid tube 22. In the preferred embodiment, the evacuation is carried out to "roughing pump" levels, typically $10^{-3}$ mmHg absolute pressure. Alternately higher vacuum levels could be achieved using high vacuum pumps or getters or a combination of both. Higher vacuum will lead to even less convective heat loss. In one embodiment covered tube assembly 3 is filled with a gas having a lower thermal conductivity than air, which increases the thermal efficiency without the need for creating and maintaining a high vacuum.

Ribs 31 and end ribs 32 form a mounting structure for reflector 4 that holds it in the proper parabolic shape. Each rib 31 and end rib 32 is fabricated from aluminum sheet, approximately 1/8" thick and incorporate features for securely attaching to reflector 4 and to front cover 27. Slot 35 is created in ribs 31 to receive cover tube 34 (see FIG. 5). At each end of solar collector 1, end rib 32 includes features for securing to each end cap 23 and this holds covered tube assembly 3. End ribs 32 provide features for mounting the entire collector in a frame 33. End ribs 32 also provide mounting for the rotation bearings (not shown) of the system. Alternate manufacturing techniques could be employed such as a molded or extruded metal or plastic assembly incorporating the reflector and rib structures.

Together ribs 31, end ribs 32, reflector 4, and front cover 27 integrate to form the supporting structure of solar collector 1. Now regarding FIG. 6, strategically placed fastening points 33 between reflector 4 and ribs 31 or end ribs 32, and fastening points (not shown) between front cover 27 and ribs 31 or end ribs 32, provide structural integrity. The aluminum used for ribs 31 and end ribs 32 is formed to be a 95% reflection. The preferred embodiment uses poprivets at points 33 to fasten reflector 4 to ribs 31 or end ribs 32, and grommet screws to fasten front cover 27 to ribs 31 or end ribs 32. Alternate fastening means include welding, crimping, or adhesives. The structural integrity achieved by integrating together ribs 31 and end ribs 32, reflector 4, and front cover 27 allows solar collector 1 to be fabricated in a manner that minimizes its weight and bulk. This greatly expands its mounting options, particularly making it available for non-industrial installations.

Assembled, the preferred embodiment of solar collector 1 is 30 inches wide and 94 inches long, with a collection area of 2,820 square inches and a focal distance of one foot. In the orientation shown in FIG. 5, the combined height of frame 33 and solar collector 1 is 24". And solar collector 1 employs 32 photovoltaic cells 5, each 1.3" wide, on the eight cell mounting structures 21.

In the preferred embodiment front cover 27 is clear and without lens features. Front cover 27 protects covered tube assembly 3 and reflector 4 from dust, rain, and damage. Front cover 27 is structurally attached to both ribs 31 and end ribs 32, and reflector 4, and is made of clear polycarbonate approximately 1/8" thick. Polycarbonate is a ultra-violet ("UV") stabilized material. Care must be taken in material selection because of the long term UV exposure and structural aspects. Typically UV stabilized polycarbonate has an "in sun" lifetime of 10-15 years. Photovoltaic cells 5 and other system components may last 15-25 years. Front cover 27 may be replaceable to allow solar collector 1 a longer service life. And to maintain the efficient transmission of solar radiation, front cover 27 may be regularly cleaned or equipped with a disposable transparent sheet (not shown).

Returning to FIG. 2, concentrating collection systems perform optimally when equipped with rotational tracking that keeps the system directed toward the sun's rays. In a preferred embodiment tilt actuator and sensor 11 may use a worm gear drive mechanism (not shown) with large driven gear (not shown) attached to end rib 32 (see FIG. 5). The small worm gear (not shown) is mounted tangent to the large driven gear. A large reduction ratio is used allowing a small 12 v DC electric motor (not shown) to effect the motion. The large reduction ratio also provides resistance to wind pressures and prevents the panel form moving inadvertently. Alternate embodiments use a chain or belt drive mechanism, or linear drive mechanisms acting on a tangent to the arc of motion. In the preferred embodiment the rotation range is much wider than that required for simply tracking the sun. The rotation range is great enough to allow solar collector 1 to be positioned with front cover 27 facing "down," and protected by reflector 4 from the elements. This might allow the system to survive storms, or prevent over-heating that could damage front cover 27 or covered tube assembly 3, or simply extend system life by protecting front cover 27 at night. In one embodiment, such a "down" or safe position is made to further protect solar collector 1 by adding a parking structure (not shown) to frame 33 and "nesting" solar collector 1 into the parking structure.

Tilt tracking provides optimal solar collector 1 alignment throughout the year. The range of tilt is less than the range of rotation. Tilt tracking is sometimes referred to as second axis tracking. In the preferred embodiment the tilt actuator and sensor 11 (FIG. 2) uses a rack and pinion drive (not shown). Alternatively, a linear drive mechanism could be used.

One function of control and interface module 13 is to maintain a desired solar collector 1 alignment using the rotation actuator and sensor 9 and tilt actuator and sensor 11. Once solar collector 1 has been installed, the proper tilt and rotation for a given time and place can be computed. No feedback is required. Based on the date and time of day control and interface module 13 adjusts the tilt and rotation for optimal alignment of solar collector 1 with the sun's rays. Local features may shade solar collector 1 and in an embodiment a feedback loop based on "peaking" the power output is employed to position solar collector 1 at the tilt and rotation that provides the peak power output.

Another function of control and interface module 13 is to protect solar collector 1. Solar collector 1 may be damaged if photovoltaic cells 5 are overheated. This could occur if the fluid flow within core fluid tube 22 were interrupted. With input from fluid flow sensor 15 indicating reduced flow, control and interface module 13 can adjust the tilt or rotation to move solar collector 1 away from optimal alignment with the sun's rays, thus protecting photovoltaic cells 5 from damage. In an embodiment, temperature sensors (not shown) are incorporated in or on cell mounting structure 21 that input to control and interface module 13, which determines the operating temperature of photovoltaic cells 5 and adjusts tilt and rotation of solar collector 1 as needed. Control and interface module 13 is also programmed with sunrise and sunset calculations that cause it to rotate the solar collector "down" at night—with front cover 27 beneath reflector 4. And, in case of a potentially damaging storm, a switch (not shown) allows an operator to cause control and interface module 13 to tilt the solar collector 1 "down." Alternatively a motion sensor such as a multi-axis accelerometer can be fixed to solar collector 1 to indicate vibrations, such as those caused by high winds. In such a situation, should the vibrations exceed a set threshold, control and interface module 13 could automatically park the Solar Collector in the "down" position.

Figure 6:
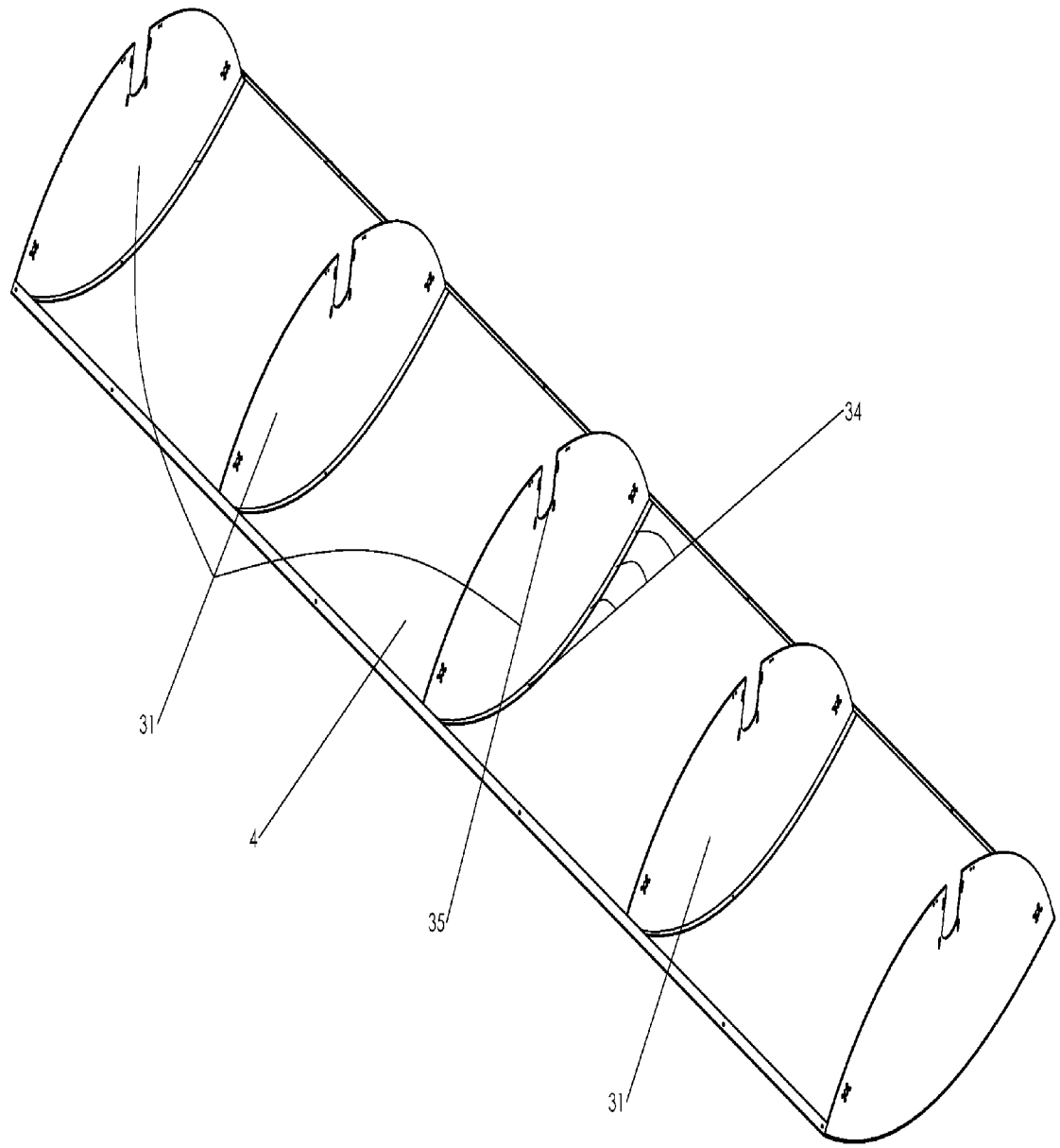
FIG. 6 depicts part of the solar collector in FIG. 5.

FIG. 6 shows part of the solar collector of FIG. 5, featuring fastening points 34 and frame 33.

Figure 7:
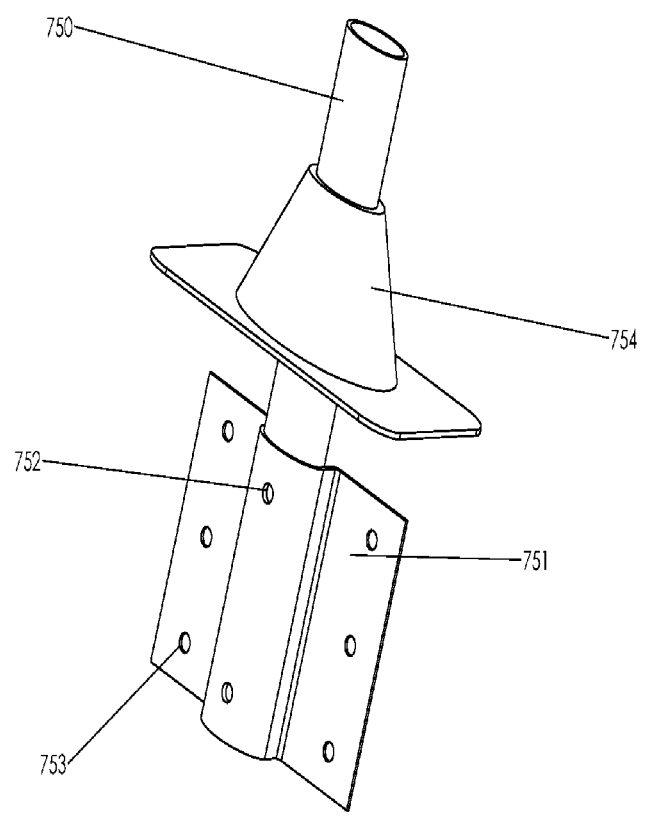
FIG. 7 is a drawing of a roof mounting bracket for the solar collector embodiments exemplified herein.

FIG. 7 shows a roof mounting bracket useful with the solar collector embodiments described herein and particularly useful for mounting efficiently on a surface to permit full range of motion both in the rotational axis and the tilt axis. As shown on FIG. 7, 750 is the mount pipe, 751 is the bracket plate, 752 holes in pipe and plate, 753 holes in plate, and 754 is the seal boot. The collector frame can be mounted by using a pipe of standard diameter size flattened on one end and drilled with several holes so it can be fastened to the roof joist under the roof. The round end of the pipe will protrude thru the roof and act as a mount point for a tilt pivot elbow for the collector frame assembly. A standard plumbing vent pipe roof seal boot will be used to at all four protruding pipes to seal the pipe to the roof. These vent seal boots are the standard in the plumbing industry for pipe roof protrusions. The resulting mount pipes will also allow the electrical and plumbing for the collector to be passed thru under the roof where they will be protected from weathering and heat loss.

FIGS. 8a-8i show cross-sectional layered structures of a solar receiver of an embodiment described herein. FIG. 8a depicts a wafer 899 with a{111} crystal orientation, about 100 to about 150 mm in diameter, about 2 to about 5 mm thick, boron doped about 0.2 to about 0.5 ohm-cm. Alternatively, the silicon can be crystalline, polycrystalline, black amorphous, gallium doped, or other silicon known to one of ordinary skill. FIG. 8a shows an oxide layer 898 on the top and bottom that is 5000 Angstroms thick with a silicon layer 897 between. FIG. 8b shows the top oxide layer removed. In this step, a pyramid shape may be etched in the top 5 microns deep. Other orientations may be used as known to one of ordinary skill in the art. FIG. 8c shows a doped silicon layer 896, which may be doped with phosphorus for example and may be 0.1 micron deep to a resistance of 0.01 ohm-cm2 for example. FIG. 8d shows a 600 Angstom thick nitride top textured surface 895. FIG. 8e shows a top coating of 10 microns thick photoresist 894 over the top of the nitride surface 895. FIG. 8f shows a wet etch of the top layer through the nitride surface. FIG. 8g shows a vapor deposition of titanium, palladium on the top and bottom with layers of about 200 to about 250 Angstroms. FIG. 8h shows the photoresist removed with an acetone ultrasonic clean. FIG. 8i shows an electroplating step where a 35 micron thick layer of silver is deposited thereon.

Figure 9:
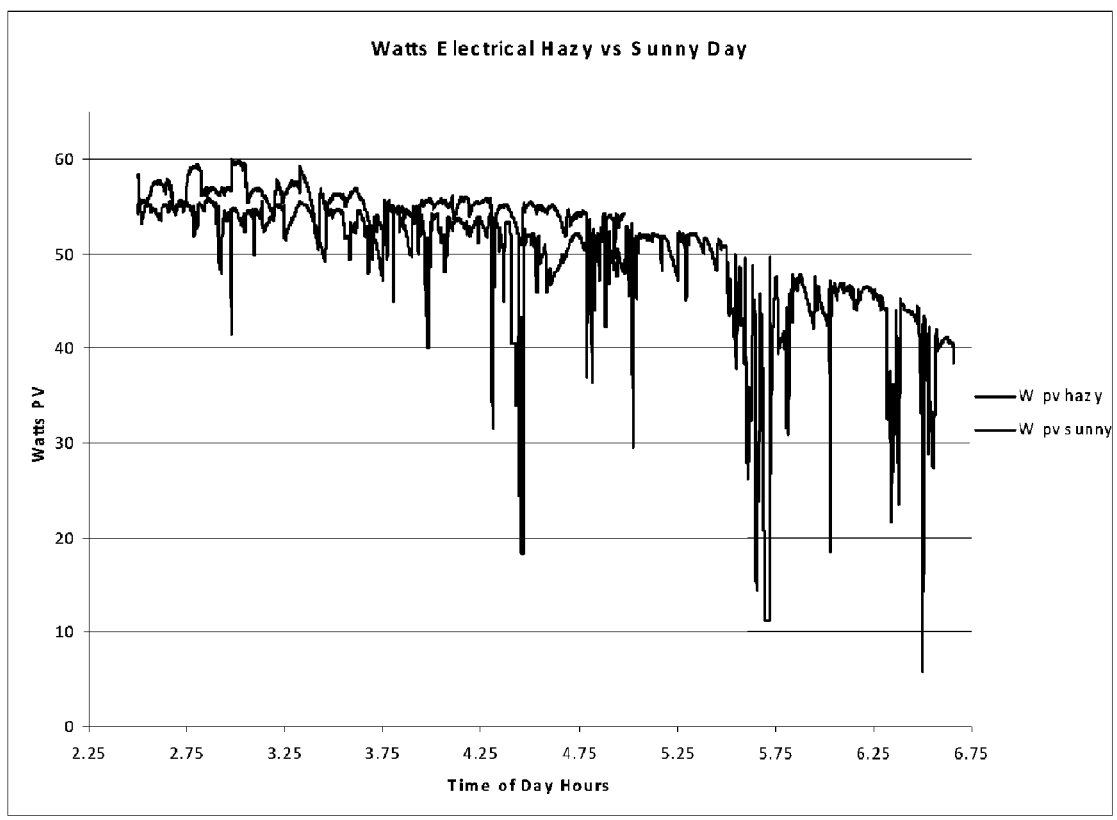
FIG. 9 shows a comparison of a high concentration solar collector's performance on sunny day versus on a hazy day.
Figure 9A:
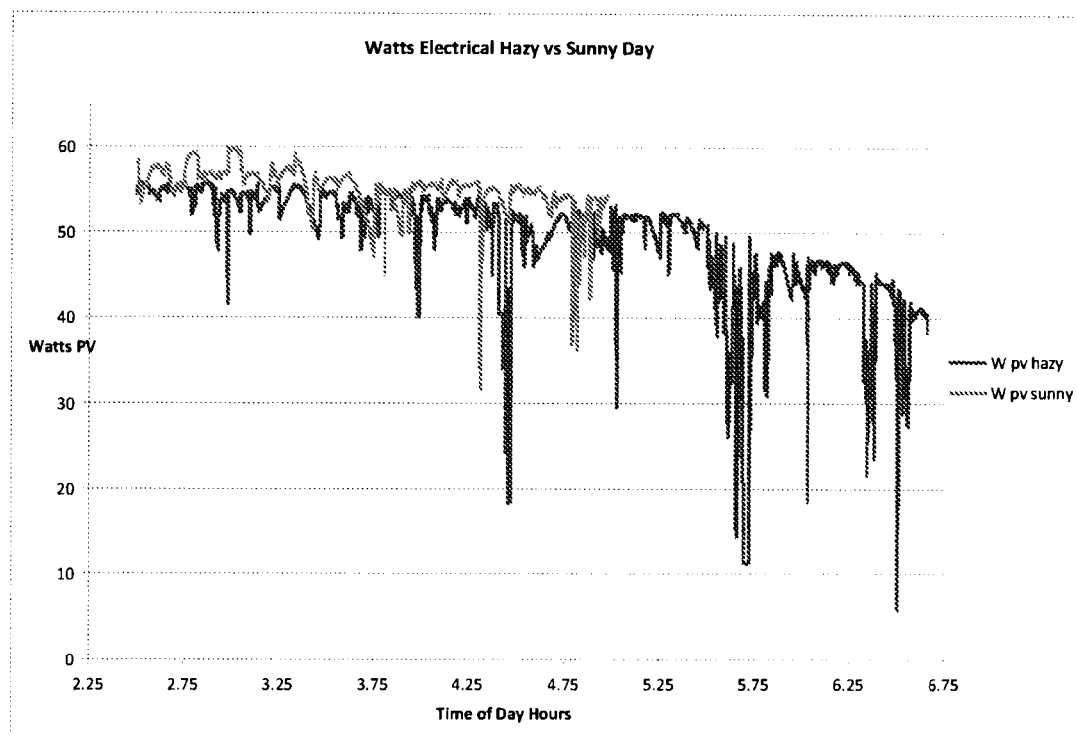
FIGS. 9a-9b are charts showing the performance of different solar concentrators.
Figure 9B:
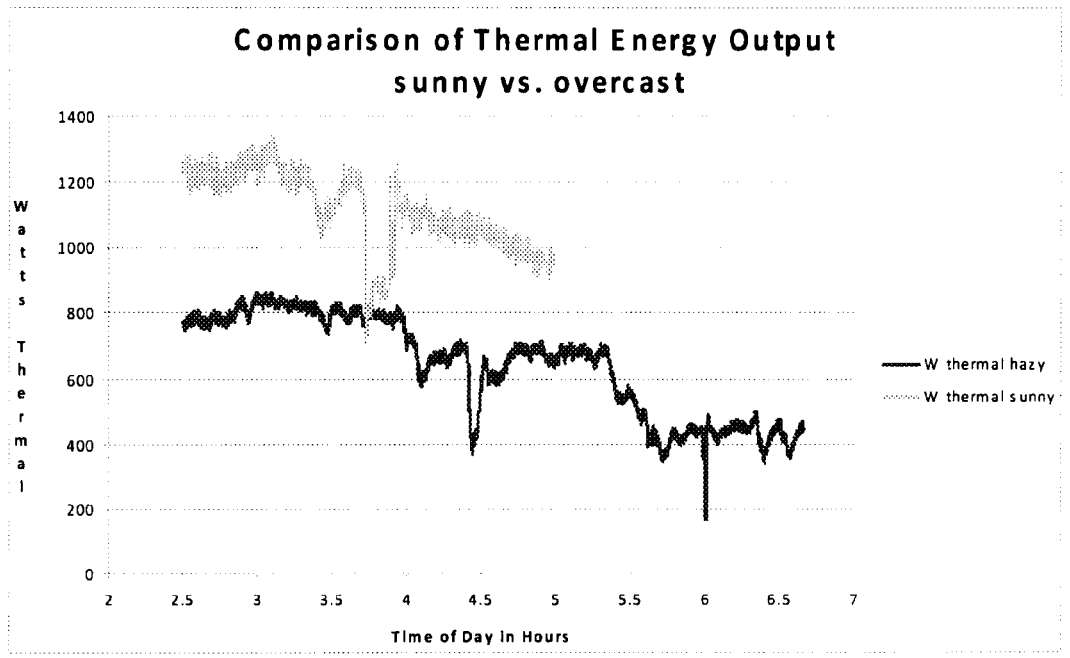
Figure 10:
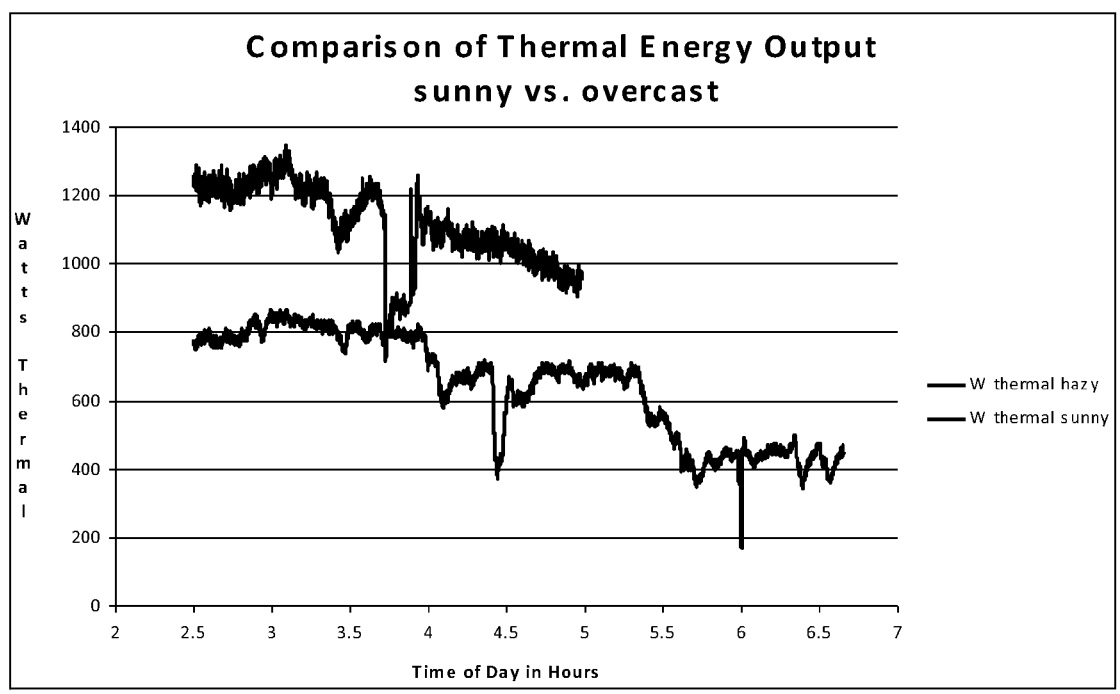
FIG. 10 shows a comparison of thermal energy on sunny day versus on a hazy day.

An advantage of the embodiments herein is shown in FIGS. 9a and 9b. The first graph, FIG. 9a, is a comparison of the same collector's performance on two separate days. The first day is sunny and at full solar incidence on a collector trough. The second day is hazy with high and low clouds in the sky. As can been seen from the two lines, the electrical performance is almost the same. A drop of about 7% is determined by considering the area under the two curves. Collectors consistent with the embodiments herein hold nearly the same electrical output due, at least in part, to the wide angle of solar radiation acceptance.

In contrast, a high concentration collector system demonstrates a dramatic power fall-off on hazy or cloudy days. The second graph, FIG. 9b, shows two lines that represent the heat collection of a high concentration solar collector. As can be seen, the amount of power collected is lower on the hazy day by 25%. This difference in power output between sunny and hazy days is mostly attributed to reduced portions of the spectrum reflected and absorbed by the high clouds.

While the foregoing description and drawings represent the preferred embodiments of the present invention, it will be understood that various additions, modifications and substitutions may be made therein without departing form the spirit and scope of the present invention as defined in the accompanying claims. In particular, it will be clear to those skilled in the art that the present invention may be embodied in other specific forms, structures, arrangements, proportions, and with other elements, materials, and components, without departing from the spirit or essential characteristics thereof. The presently disclosed embodiments are therefore to be considered in all respects as illustrative and not restrictive, the scope of the invention being indicated by the appended claims, and not limited to the foregoing description.

The invention claimed is:

1. A method of collecting solar energy using a solar concentrator which comprises a concentrating reflector, a plurality of silicon photovoltaic cells, and a cell mounting structure with an internal bore, transparent covered tube, and two end caps, wherein:
   said concentrating reflector directs concentrated solar radiation onto said photovoltaic cell at a solar concentration of from about 20 to 100 times that of the incident solar radiation;
   said concentrating reflector directs concentrated solar radiation onto said cell mounting structure with an internal bore containing a working fluid;
   said transparent covered tube and two end caps are positions about said cell mounting structure and said photovoltaic cell, wherein said transparent covered tube, said two end caps, and said cell mounting structure create an enclosed volume about said photovoltaic cell; and
   wherein said photovoltaic cell converts part of said concentrated solar radiation into electrical energy, part of said concentrated solar radiation is collected as thermal energy by the solar energy system.

2. The method of claim 1, further comprising a tilt mechanism and a control module in communication with said tilt mechanism wherein said control module directs said tilt mechanism to tilt said solar energy collector to a specified tilt angle.

3. The method of claim 2, wherein said control module determines said specified tilt angle using a latitude and longitude associated with said solar energy collector, and a date and time said solar energy collector is to be tilted.

4. The method of claim 3, wherein said control module receives voltage data from the photovoltaic cell and adjusts tilt angle and rotation to maximize voltage output.

5. The method of claim 2, wherein said control module receives operating data from said solar collector and adjusts direction based on said operating data.

6. The method of claim 5, wherein said operating data comprises temperature data from said solar collector and said specified rotation is chosen to reduce the temperature received by said solar collector.

7. The method of claim 5, wherein said operating data comprises a fluid flow rate.

8. The method of claim 1, further comprising a fluid tube within said bore and in thermal contact with said cell mounting structure.

9. The method of claim 1, wherein said enclosed volume is substantially evacuated.

10. The method of claim 1, further comprising a reflective coating applied to an inner portion of said transparent covered tube, wherein said reflective coating reflects said concentrated solar radiation toward said cell mounting structure.

11. The method of claim 1, further comprising an aligned plurality of cell mounting structures with bores, wherein said plurality of cell mounting structures are positioned linearly with said bores axially aligned, and said fluid tube runs through the bores the length of said aligned plurality of cell mounting structures.

12. A method of collecting solar energy using a solar concentrator which comprises a cover, a concentrating reflector, a plurality of silicon photovoltaic cells, a plurality of ribs, a cell mounting structure with an internal bore, wherein:

said cover is positioned above the photovoltaic cell and is transparent to solar radiation;

said plurality of ribs is located below said cover and above said concentrating reflector, wherein said concentrating reflector directs concentrated solar radiation onto said photovoltaic cell at a solar concentration of from about 20 to 100 times that of the incident solar radiation;

wherein said cover, said reflector, and said ribs are integrally connected together and support said solar energy collector;

said cell mounting structure with an internal bore containing a working fluid; and said photovoltaic cell is in thermal contact with said working fluid;

wherein said photovoltaic cell converts part of said concentrated solar radiation into electrical energy and part of said concentrated solar radiation is collected as thermal energy by the solar energy system.

13. The method of claim 1, wherein said transparent covered tube contains one or more getters.

14. The method of claim 1, wherein said transparent covered tube is filled with a gas having a lower thermal conductivity than air.

15. The method of claim 12, wherein said working fluid is a wax.

16. A method of manufacturing a solar energy collector for later assembly, the method comprising:

creating a cover, a reflector, a plurality of ribs, a covered tube assembly, and a plurality of silicon photovoltaic cells, wherein on later assembly said reflector is to be positioned about said ribs to form a concentrating reflector to reflect concentrated solar radiation on to said silicon photovoltaic cells at a concentration of from about 20 to 100 times that of the incident solar radiation, said ribs are to be positioned about said covered tube assembly to place said covered tube assembly at a focal point of said concentrating reflector, and said cover is to be positioned about said covered tube assembly at a positioned determined by said concentrating reflector.

17. The method of claim 16 wherein said covered tube assembly comprises a bore for containing a working fluid.

18. The method of claim 16 wherein said covered tube assembly comprises a plurality of photovoltaic cells with spacings of less than 100 microns between the P+ and the N+ regions.

19. The method of claim 1, wherein the reflected solar radiation is at a solar concentration of from about 20 to about 50 times that of the incident solar radiation.

20. The method of claim 12, wherein the reflected solar radiation is at a solar concentration of from about 20 to about 50 times that of the incident solar radiation.

* * * * *